United States Patent [19]

Obara

[11] Patent Number: 5,071,612
[45] Date of Patent: Dec. 10, 1991

[54] METHOD FOR SEALINGLY MOLDING SEMICONDUCTOR ELECTRONIC COMPONENTS

[75] Inventor: Shoji Obara, Kitakyushu, Japan
[73] Assignee: Kabushiki Kaisha Toshiba, Kawasaki, Japan
[21] Appl. No.: 483,299
[22] Filed: Feb. 20, 1990

Related U.S. Application Data

[63] Continuation of Ser. No. 282,659, Dec. 12, 1988, abandoned.

[51] Int. Cl.⁵ .................. B29C 45/14; B29C 37/02
[52] U.S. Cl. .................. 264/161; 264/138; 264/272.14; 264/272.17
[58] Field of Search .......... 264/102, 272.11, 272.17, 264/272.14; 425/116, 125, 812; 249/141

[56] References Cited

U.S. PATENT DOCUMENTS

| 4,032,963 | 6/1977 | Thome | 264/272.17 |
| 4,188,708 | 2/1980 | Frederiksen | 29/592 |
| 4,862,586 | 9/1989 | Osada | 264/272.17 |

FOREIGN PATENT DOCUMENTS

| 54-152970 | 1/1979 | Japan | 425/812 |
| 54-122360 | 9/1979 | Japan | 264/272.17 |
| 61-4234 | 1/1986 | Japan | 264/272.17 |
| 61-117842 | 6/1986 | Japan | 425/812 |
| 61-144033 | 7/1986 | Japan | 264/272.17 |
| 62-98733 | 5/1987 | Japan | 425/812 |

Primary Examiner—Jan H. Silbaugh
Assistant Examiner—Angela Ortiz
Attorney, Agent, or Firm—Finnegan, Henderson, Farabow, Garrett, and Dunner

[57] ABSTRACT

A molding apparatus for sealingly molding semiconductor electronic components is provided which includes a pair of molding body halves having cavities each holding a corresponding semiconductor electronic component on the upper surface portion of at least one molding body halves, a corresponding gate communicating at one open end with the associated pair of cavities to allow a thermosetting resin to flow into the respective cavity so that a semiconductor electronic component is obtained as a finished product at the location of the cavity, and a groove which, upon placing a lead frame on the upper surface of the molding body half, faces an unnecessary lead. The groove is coupled at one open end to the associated cavities and at the other open end to an outer air. Upon the molding of the semiconductor electronic component as a finished product, air and/or any extra thermosetting resin can be discharged from the associated cavity into the outer atmosphere via the aforementioned groove. Some resin, deposited on the groove, can be removed, together with the unnecessary lead, from the rest of the finished product.

1 Claim, 3 Drawing Sheets

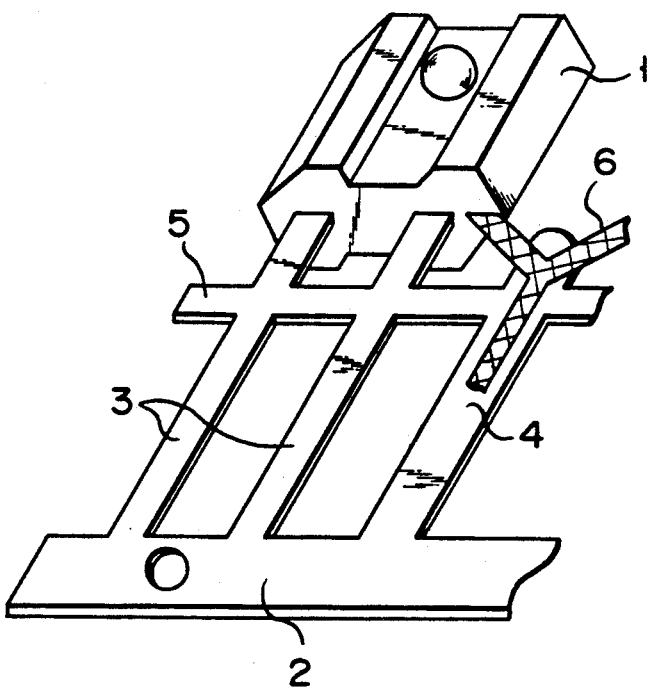
F I G. 4

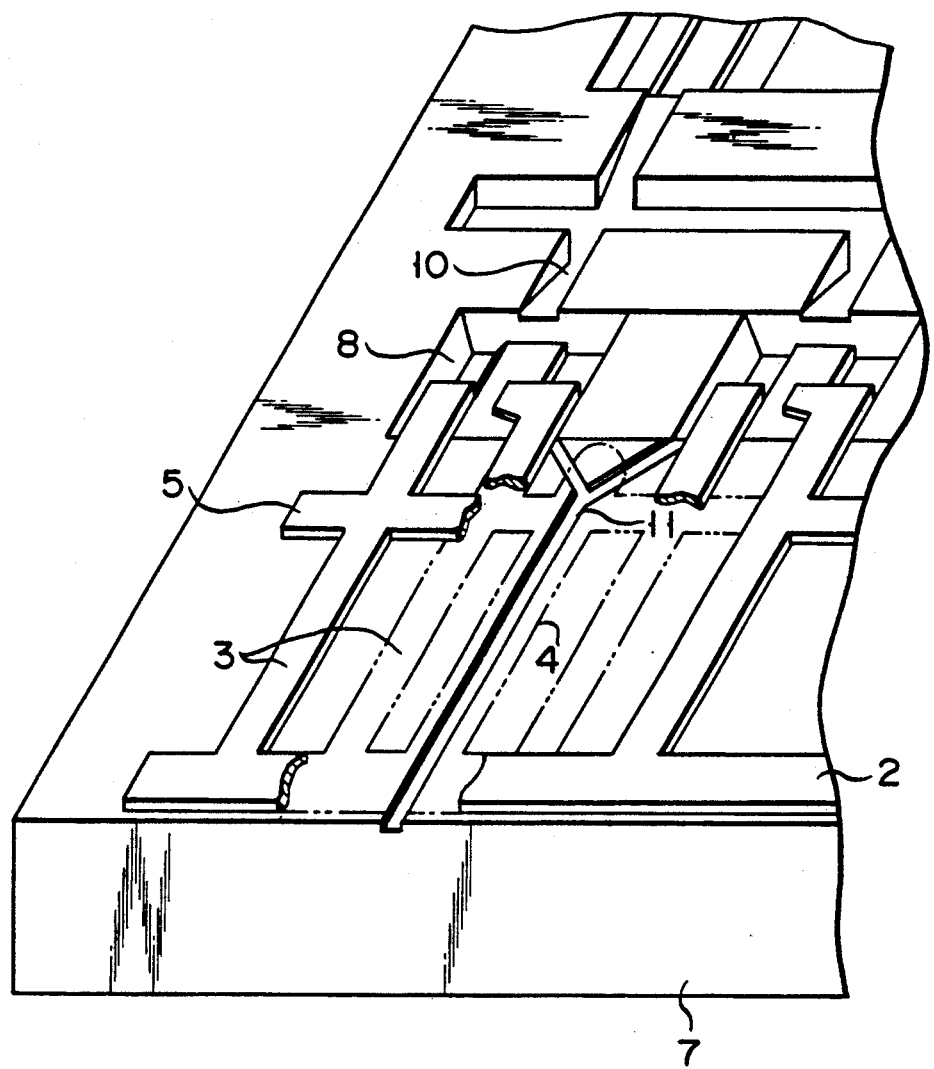
F I G. 3

METHOD FOR SEALINGLY MOLDING SEMICONDUCTOR ELECTRONIC COMPONENTS

This application is a continuation, of application Ser. No. 07/282,659, filed Dec. 12, 1988, now abandoned.

BACKGROUND OF THE INVENTION

1. Field of the Invention

The present invention relates to a molding apparatus for molding semiconductor electronic components in a sealing fashion and, in particular, a molding apparatus which, upon sealingly molding semiconductor electronic components with a thermosetting resin, can discharge air, or air and thermosetting resin, trapped at or near the mold cavities via a groove which is provided on the surface portion of a pair of molding body halves at a location facing an unnecessary lead of those lead frames.

2. Description of the Related Art

FIGS. 1 and 2 show a conventional molding apparatus for sealingly molding semiconductor electronic components. In FIG. 1, molding body half 7 as shown in perspective view is of such a type that semiconductor electronic components ar held each within mold cavity 8 with the semiconductor electronic component electrically connected to the forward ends of leads 3 of lead frame 2 to allow them to be obtained as resin-sealed products 1. Lead frame 2 has, in parallel fashion, leads 3 made up of a pair of leads and unnecessary lead 4 which is eliminated upon the completion of a molding operation. Leads 3 and unnecessary lead 4 are coupled by a tiebar 5. Subsequent to disposing the semiconductor electronic component in place within mold cavity 8 a molten thermosetting resin is flowed via resin inlet hole 10 of molding body half 7 into the mold cavity with the other molding body half placed on the first-mentioned molding body half. In this case, the semiconductor electronic component is sealed with the resin such that the associated leads are connected to the semiconductor electronic component. Air outlet groove 9 is provided along leads 3 in the molding body half such that it is located at a place opposite to resin inlet hole 10. Upon the sealing of the semiconductor electronic component with the resin, air trapped within cavity 8 is discharged via groove 9 to the outer air. The discharge of the air at that time often involves a simultaneous discharge of some of the molten resin so that the resin is deposited partially on leads 3 as shown in FIG. 2. The resin, if deposited on tiebar portion 5 only, can be removed at a subsequent lead separation step following the aforementioned resin sealing step, but, if deposited on leads 3 of the lead frame, any extra separation step is required during the manufacture of semiconductor electronic components.

SUMMARY OF THE INVENTION

It is accordingly the object of the present invention to provide a molding apparatus which sealingly molds semiconductor electronic components, as finished products, with a thermosetting resin without involving the deposition of any excessive thermosetting resin discharged from an associated mold cavity onto the leads of the lead frame of the semiconductor electronic components during a molding operation.

In order to achieve the aforementioned object a molding apparatus is provided which sealingly molding semiconductor electronic components, the apparatus comprising a pair of molding body halves for allowing a plurality of semiconductor electronic components and plurality of pairs of leads to be matingly sandwiched therebetween such that each pair of leads in the lead frame are electrically connected to the semiconductor electronic component with an unnecessary lead defined relative to adjacent pairs of lead wires and adapted to be removed away from the rest of each finished product which is formed with a thermosetting resin and which is supported by the pair of leads, wherein at least one of the pair of molding body halves comprises a plurality of cavities each adapted to hold a respective semiconductor electronic component; a gate section coupled to the corresponding cavity and through which the thermosetting resin is flowed into the cavity to mold the semiconductor electronic component therewith; and a groove formed on an upper surface portion of one molding body half and extending along said unnecessary lead of said lead frame, connected at one open end to the corresponding cavity and at the other open end to an outer air, and adapted to discharge air which is trapped within the cavity into the outer air when the semiconductor electronic component is molded with the thermosetting resin.

It is, therefore, possible to prevent any excessive amount of thermosetting resin from being deposited on leads on the finished products during the molding operation and hence to save any extra resin removing step.

BRIEF DESCRIPTION OF THE DRAWINGS

FIG. 3 is a perspective view diagrammatically showing one molding body half of a molding apparatus for sealingly molding semiconductor electronic components according to the present invention; and FIG. 4 is a perspective view showing a finished product, manufactured on the molding apparatus of the present invention, with a lead frame connected to the product.

DETAILED DESCRIPTION OF THE PREFERRED EMBODIMENT

Figure 1:
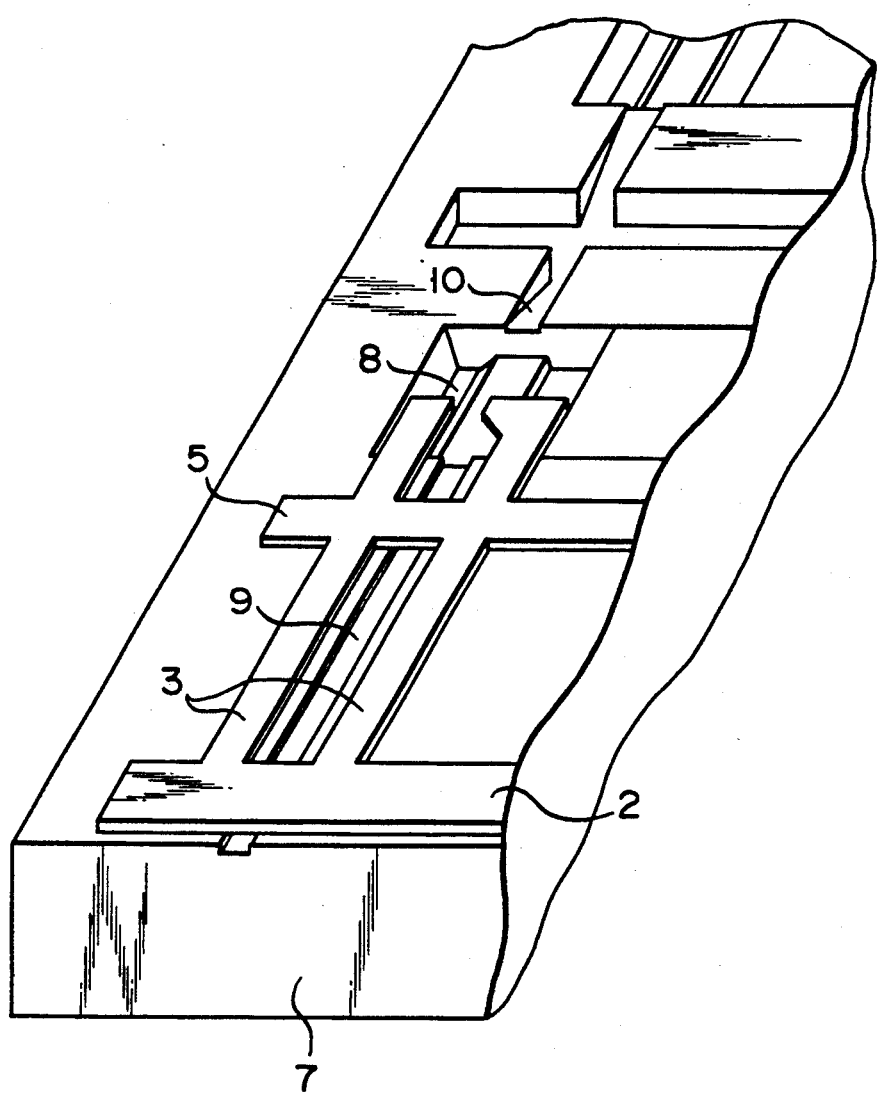
FIG. 1 is a perspective view showing one molding body half of a molding apparatus for sealingly molding semiconductor electronic component.
Figure 2:
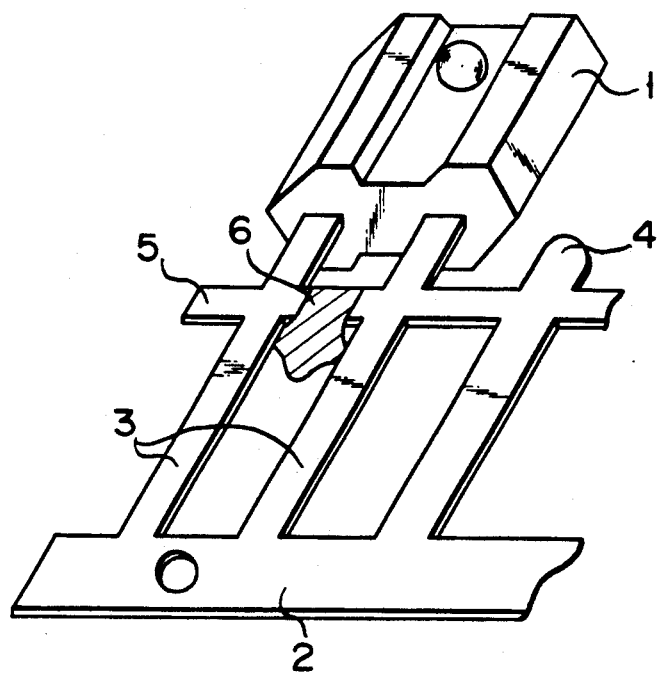
FIG. 2 is a perspective view showing a finished product, manufactured on the conventional molding apparatus, with a lead frame connected to the product.

A molding apparatus according to the present invention will be explained below with reference to FIGS. 3 and 4.

As shown in FIG. 3, a plurality of cavities 8 are provided in parallel array in molding body half 7 of the molding apparatus to hold semiconductor electronic components therein. Semiconductor electronic components are located within cavities 8 such that their lead frame 2 is placed in a predetermined position on the upper surface of apparatus body 7 with the forward end portions of a pair of leads 3 situated at the corresponding cavity. Lead frame 2 is formed of a plurality of pairs of leads 3, unnecessary lead 4 located between the adjacent pairs of leads and tiebar portion 5 connected to and supporting, both the pair of leads 3 and unnecessary lead 4. A groove is provided on molding body half 7 and communicates with each cavity 8 so that it serves as gate section 10 through which a thermosetting resin is flowed into the cavity of the mold. Groove 11 is formed on the upper surface portion of body half 7 at a location directly below unnecessary lead 4 such that one open end thereof communicates with cavity 8 with the other end opening into the outer air.

Subsequent to placing each semiconductor electronic component in the corresponding mold cavity with a pair of leads 3 placed in contact with the associated semiconductor electronic component, the other body half not shown, is matingly placed on the associated molding body half and then a thermosetting resin is flowed by an external pressure from gate section 10 into cavity 8. As a result, semiconductor electronic components can be molded, as finished products, within cavity 8 with the thermosettinq resin. At this time, trapped air within cavity 8 is forced via groove 11 into the outer air. If an amount of thermosettinq resin exceedinq the capacity of cavity 8 is forced into the cavity, then it can be controlled to a proper level because any excessive resin is overflowed into groove 11. Upon being molded with the thermosetting resin, the semiconductor electronic component is withdrawn, as a finished product, from the molding apparatus, the product being shown in FIG. 4. The air trapped within cavity 8, as well as an excessive amount of thermosetting resin, is taken out of the molding apparatus with that extra resin portion deposited on unnecessary lead 4 of lead frame 2. In this case, a finished product can be obtained if unnecessary lead 4, together with the resin deposited thereon, is removed from the rest of the apparatus body.

Thus the excessive resin as flowed out from the cavity after the molding step is trapped at the location of unnecessary lead 4, not of the associated pair of leads, thus obviating the need of adding any extra step of removing an excessive amount of resin which has otherwise been deposited on the aforementioned associated pair of leads on the molding apparatus.

Although the present invention has been explained as providing the cavity, gate and groove on the upper surface portion of one molding body half, it can also be applied to the case where a cavity, gate and groove are symmetrically provided on the upper surface portion of the mating mold of each molding body half.

What is claimed is:

1. A method for encapsulating a plurality of semiconductor electronic components and a plurality of leads in a lead frame, each of the plurality of leads in the lead frame being electrically connected to the semiconductor electronic components and the lead frame including an unnecessary lead removable from the lead frame, the method comprising the steps of:

placing the semiconductor electronic components in a cavity in a mold;

introducing thermosetting resin through a gate in the mold into the cavity n order to encapsulate the semiconductor electronic components and such that the amount of thermosetting resin exceeds the capacity o the cavity, sealingly molding the semiconductor electronic components in the resin and;

discharging excess air and resin for the cavity from a groove oriented in adjoining relationship with the unnecessary lead with an extra resin portion deposited on said unnecessary lead;

removing the lead frame, the semiconductor electronic components, and the resin from the mold; and removing the unnecessary lead together with the resin deposited thereon from the lead frame.

* * * * *

UNITED STATES PATENT AND TRADEMARK OFFICE
CERTIFICATE OF CORRECTION

PATENT NO. : 5,071,612
DATED : December 10, 1991
INVENTOR(S) : Shoji OBARA

It is certified that error appears in the above-identified patent and that said Letters Patent is hereby corrected as shown below:

Claim 1, column 4, line 20, change "n" to --in--.

Claim 1, column 4, line 23, change "o" to --of--.

Signed and Sealed this

Thirteenth Day of July, 1993

Attest:

MICHAEL K. KIRK

Attesting Officer

Acting Commissioner of Patents and Trademarks